United States Patent [19]

Haus

[11] 4,184,131
[45] Jan. 15, 1980

[54] ELECTRICAL FILTER OF CASCADED SURFACE ACOUSTIC WAVE RESONATORS

[75] Inventor: Hermann A. Haus, Lexington, Mass.

[73] Assignee: Massachusetts Institute of Technology, Cambridge, Mass.

[21] Appl. No.: 926,380

[22] Filed: Jul. 20, 1978

[51] Int. Cl.² .................. H03H 9/26; H03H 9/32; H03H 9/02
[52] U.S. Cl. .................. 333/195; 333/196
[58] Field of Search .................. 333/193–196, 333/150–155; 310/313; 330/5.5; 331/107 A

[56] References Cited

U.S. PATENT DOCUMENTS

| | | | |
|---|---|---|---|
| 3,781,717 | 12/1973 | Kuenemund | 310/313 X |
| 3,970,970 | 7/1976 | Worley | 333/195 |
| 4,013,983 | 3/1977 | Hartemann | 333/195 |
| 4,054,851 | 10/1977 | Borner et al. | 330/5.5 X |

Primary Examiner—Alfred E. Smith
Assistant Examiner—Marvin Nussbaum
Attorney, Agent, or Firm—Arthur A. Smith, Jr.; Martin M. Santa

[57] ABSTRACT

Surface acoustic wave resonators are used to provide band pass filters. The length of each resonator is related to the lumped constant inductor and capacitor values of the components of the low pass filter equivalent. This invention allows high frequency s.a.w. type filters to be constructed by reference to already available inductor and capacitor values from tables of low pass filter designs.

2 Claims, 11 Drawing Figures

NORMALIZED FREQ.

ELECTRICAL FILTER OF CASCADED SURFACE ACOUSTIC WAVE RESONATORS

The Government has rights in this invention pursuant to Contract Number DAAB07-75-C-1346 awarded by the Department of the Army.

BACKGROUND OF INVENTION

The design of filters with lumped elements is a well advanced art. Darlington (*J. Math. Phys.*, 18, 257–353, Sept. 1939) has shown how the elements of a filter may be found for a prescribed transmission versus frequency (power transmission ratio) subject to certain constraints so as to make the filter physically realizable with passive elements. A power ratio with prescribed maximum excursions within the passband is conveniently represented by a Tchebysheff polynomial of the first kind. There are many other filter types that realize given transmission characteristics (Zverev, *Handbook of Filter Synthesis*, John Wiley and Sons, 1967). Tchebysheff filters have been realized with microwave cavities by utilizing their lumped circuit representation (Microwave Transmission Circuits, McGraw Hill Book Co., Inc., 1948).

Surface Acoustic Wave (s.a.w.) resonators have been realized recently with very high Q's (Li, R. C. M., J. A. Alusow, and R. C. Williamson, 1975 *Ultrasonics Symposium Proceedings*, IEEE Cat. No. 75 CHO 994-4SO, 279–283, 1975). Identical resonators have been cascaded so as to realize a filter design with a (relatively) flat passband and steep falloffs into the cutoff bands (Haus, H. A., and R. V. Schmidt, IEEE *Trans. On Sonics and Ultrasonics*, V. SU-24, No. 2, March 1977). However, the preceding paper did not disclose the criteria for realizing specific filter designs with s.a.w. resonators.

SUMMARY OF THE INVENTION

This invention provides a method for realizing electrical filters with surface acoustic wave (s.a.w.) grating resonators. Specific examples of filters having Tchebysheff, Butterworth, and Gaussian transfer characteristics in the passband are used to illustrate the invention. The invention can also be applied to filters having a maximally flat delay, linear phase filters with equiripple error, and Legendre filters. In brief, any filter with a low pass prototype synthesizable with series or parallel inductors and capacitors can be realized as s.a.w. passband filter by a proper choice of the number of reflectors (e.g., grooves) in the individual cascaded grating sections.

More generally, any electrical passband filter consisting of a cascade of series and parallel branches with a series resonance circuit in each of its series branches and a parallel resonance circuit in each of its parallel branches may be realized with s.a.w. resonators. The procedure consists in choosing the number of reflectors (e.g. grooves) of the s.a.w. resonators in correspondence with the Q's of the LC circuits and the Bragg frequencies of the s.a.w. resonators equal to the resonance frequencies of the LC circuits.

BRIEF DESCRIPTIN OF THE DRAWINGS

Further objects and features as well as the construction of the novel s.a.w. bandpass filters of this invention can be more fully understood from the followng detailed description taken in conjunction with the accompanying drawings in which.

DETAILED DESCRIPTION OF INVENTION

Any filter, with a low pass prototype synthesizable with series or parallel Ls and Cs can be realized as a s.a.w. passband filter solely by a proper choice of the number of grooves in the individual cascaded grating sections.

Figure 1:
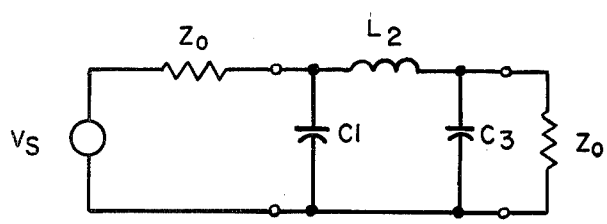
FIG. 1 is an electrical schematic diagram of a low pass prototype of a three element filter.

Consider the low pass prototype of a three element filter in FIG. 1. To achieve a certain filter characteristic, one may pick the values of Ls and Cs from filter-design tables as in the book by Zverev. In all tabulations, the bandwidth $\omega_b$ of the design is picked to be 1 rad/s, and the characteristic impedance is $$Z_o = 1 Y_o = 1\Omega.$$

When the prototype filter is converted to a passband filter, the transformation is made $$\omega C \rightarrow [(\omega/\omega_o)-(\omega_o/\omega)]\omega_o C = [(\omega/\omega_o)-(\omega_o/\omega)]Y_o Q_C$$

where $Q_C$ is the quality factor of the parallel resonance circuit (as a one port), and $Y_o$ is a characteristic admittance (also picked as $1\Omega$ in the normalized design). For a particular value of C lifted from the table for the lowpass prototype, the $Q_C$ is $$Q_C = (\omega_o C/Y_o)$$

for 1 rad/s bandwidth. The transformation for the impedance of the inductor is $$\omega L \rightarrow [(\omega/\omega_o)-(\omega_o/\omega)]\omega_o L = [(\omega/\omega_o)-(\omega_o\omega)]Z_o Q_L$$

The corresponding value of Q for the series resonance circuit derived from the inductor is $$Q_L = \omega_o L / Z_o$$

For a bandwidth of w rad/s all capacitors and inductances have to be decreased by a factor of w. Therefore, the Qs of the required resonance circuits are reduced by the factor w when the bandwidth is increased by the factor w:

$$Q_C = (\omega_o C)/(w Y_o), \text{ and}$$

$$Q_L = (\omega_o L)(w Z_o)$$

Figure 2:
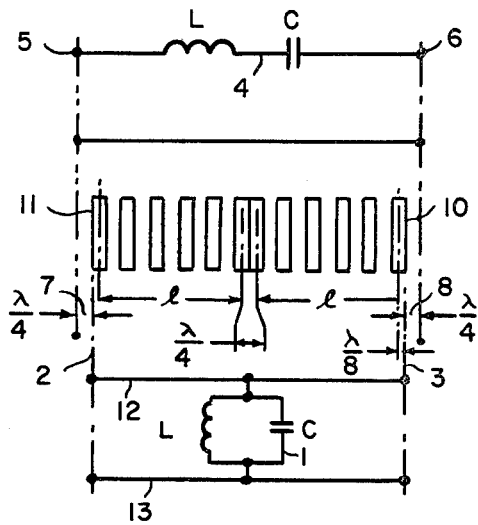
FIG. 2 shows a s.a.w. resonator constructed of two gratings spaced one-quarter of a wavelength apart with its equivalent electrical tuned circuits shown as dependent on the reference planes of the resonator.

A s.a.w. resonator constructed as in FIG. 2 of two identical gratings each of length l separated by a quarterwave section resonates at the center of the stop band of the individual gratings (at the Bragg frequency). In the neighborhood of the resonance frequency, the equivalent circuit is a two port with a parallel resonance circuit 1 across two shorting bars 12, 13. This equivalent circuit applies when the reference planes 2, 3 are chosen $\lambda/8$ beyond the center planes of the last groove or finger on the edges of the gratings. The addition of two quarterwave sections 7, 8 to each side of a two port transforms the admittance matrix of the two port into its impedance matrix, the parallel LC circuit across the shorting bars into a series circuit 4 in one branch connecting the top input and output terminals 5, 6. The series resonance circuit 4 represented by the inductance in the low frequency prototype must have a Q given by $\omega_o L/w Z_o$.

The external Q, of the resonator, is given by $$Q_{ext} = (\omega_o \sinh^2 \kappa l)(v_g \kappa)$$

where $\kappa$ is the coupling constant of the grating, $v_g$ is the group velocity and $\omega_o$ the center, or Bragg, frequency. This external Q is defined as the Q of the transmission cavity, as a two port.

Now $Q_C$ or $Q_L$ is the Q of the LC resonance circuit as a one terminal pair element. Therefore, $Q_C$ or $Q_L = 2Q_{ext}$. For a given $\kappa$, i.e., a given reflection from each of the reflectors (e.g., grooves) making up the resonator, one may find the length l of each of the two gratings of the resonator, by inverting the equation for $Q_{ext}$ $$l = 1/\kappa \ln\{a + 29 (a^2 + 1)\} \quad (1)$$

where $$a \equiv (v_g/\omega_o) \cdot (Q/2) \quad (2)$$

where Q is $Q_C$ or $Q_L$ depending upon whether the parallel resonant circuit or the series resonant circuit is being realized by the s.a.w. resonator.

Figure 3:
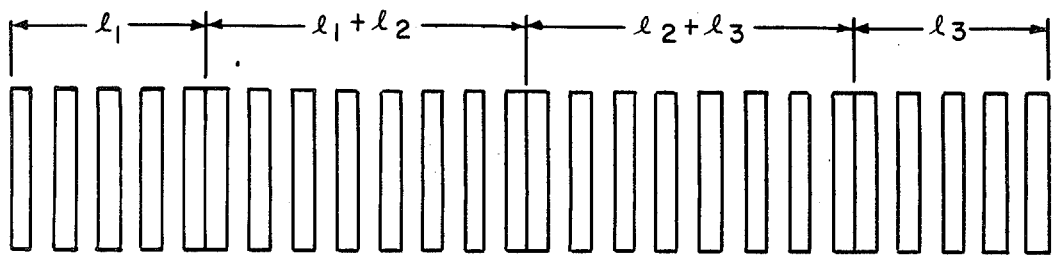
FIG. 3 shows a s.a.w. filter made from three serially cascaded resonators.
Figures 4A, 4B:
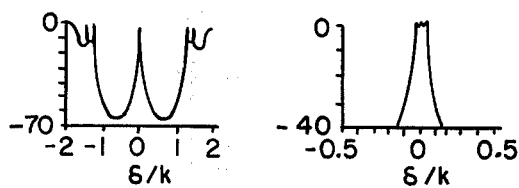
FIGS. 4A, 4B, 5A, 5B, 6A, 6B, show the filter characteristics obtainable from the s.a.w. resonators assembled in accordance with this invention where the transfer characteristic in the passband are Tchebysheff, Butterworth and Gaussian respectively.
Figures 5A, 5B:
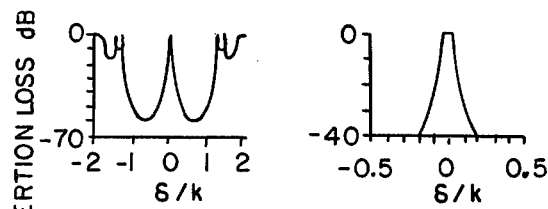
Figures 6A, 6B:
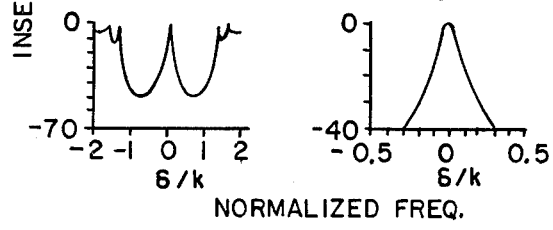

Consider a filter made up of three resonators and suppose their one-half lengths have been evaluated from the preceding formula to be $l_1$, $l_2$, and $l_3$. Then the s.a.w. filter realization consists of four grating sections of lengths $l_1$, $l_1 + l_2$, $l_2 + l_3$, and $l_3$, respectively, as shown in FIG. 3. For example, the grating section of length $l_1 + l_2$ is formed of one-half of the length of the first and second resonators. Each section is a uniformly spaced grating. This gratifying feature of the resonator design results from the cascade of two $\lambda/8$ and one $\lambda/4$ sections: the reference plane 3 of the first resonator $\lambda/8$ beyond the center of the last groove 10, followed by the quarterwave section, $\lambda/4$, leads to reference plane 8 and followed by a section $\lambda/8$ between the reference plane 2 of the second resonator and the center of its groove 11.

The length of each grating section is adjusted from its calculated value to provide the nearest integer multiple of reflectors.

There are many bandpass filter designs which contain single Ls and Cs in each branch of the lowpass prototype. Every single one of these can be realized as a s.a.w. bandpass filter by the transformations indicated above. Among the filter types that can be realized in this manner are the following: Tchebysheff, Butterworth, maximally flat delay, linear phase with equiripple error, Gaussian and Legendre.

In their s.a.w. realization, all these designs utilize uniform gratings of varying lengths separated by quarterwave sections. The degree to which the ideal performance is retained in the s.a.w. realization is a function of the "goodness" of representation of the resonator in terms of a lumped L-C circuit.

FIGS. 4A, 4B, 5A, 5B, 6A, and 6B show the transmission function of three different filter designs for the Tchebysheff, Butterworth and Gaussian filter characteristics, respectively, as laid out by the lumped equivalent-circuit procedure, but computed from the full grating equations of the IEEE article referred to earlier for $\kappa = 4 \text{cm}^{-1}$, $\kappa = 0.0024$ cm. $\delta \equiv \omega/v_g - \pi/\Lambda$ where $\Lambda$ is the grating period.

TABLE 1

|   | $C_1$  | $l_1/\lambda$ | $L_2$  | $l_2/\lambda$ | $C_3$  | $l_3/\lambda$ |
|---|--------|---------------|--------|---------------|--------|---------------|
| a | 1.8636 | 201           | 1.2804 | 183           | 1.8036 | 201           |
| b | 1.000  | 170           | 2.000  | 205           | 1.000  | 170           |
| c | 0.2624 | 110           | 0.8167 | 161           | 2.2262 | 210           |

Table 1 gives the parameters for Tchebysheff (a), Butterworth (b) and Gaussian (c) filter designs where the capacitor and inductor values $C_1$, $L_2$, $C_3$ obtained from filter tables such as in the book by Zverev and the lengths of the gratings $l_1$, $l_2$, $l_3$ of each resonator (normalized with respect to the wavelength $\lambda$ of the center frequency $w_o$) corresponding to the value of $C_1$, $L_2$ and $C_3$, respectively, are calculated using the design equations of this invention. From these values of $l_1$, $l_2$, and $l_3$ a filter such as shown in FIG. 3 may be constructed by conventional grating fabrication techniques.

Although the invention has been described in detail with respect to the three element inductor and capacitor circuit as shown in FIG. 1, with its corresponding three resonator s.a.w. filter circuit in FIG. 3, it is apparent that the method of this invention may be applied to any low pass filter having additional series and parallel branches, with inductors on the series branches, and capacitors in the parallel branches by merely following the procedure provided in this specification to provide corresponding additional cascaded resonators. It should also be apparent to those skilled in the art, that the low pass filter circuit may be of the T-type rather than the $\pi$-type shown in FIG. 1.

Figure 7:
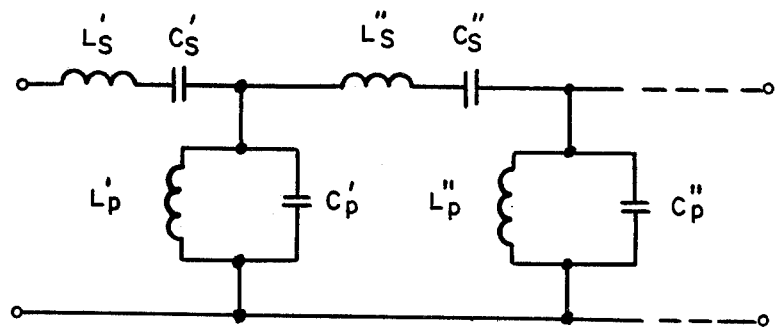
FIG. 7 is an electrical schematic of a two-section LC filter which does not have a lowpass equivalent.

Although the invention is described for synthesis of s.a.w. filters in analogy with L-C filters that possess a low pass equivalent, it can be extended to any s.a.w. filter design in correspondence with an L-C filter which does not possess a lowpass equivalent in that the resonant frequencies of the L-C circuits are not identical. See FIG. 7 for the example of a circuit with two branches. Each s.a.w. resonator can be made to possess a different resonance frequency $\omega_1$ and $\omega_2$, respectively by, for example, different reflector spacings each of two s.a.w. resonators, so that the Bragg frequencies of the resonators are made to coincide with the resonance frequencies $\omega_1$ and $\omega_2$, respectively. The lengths of the resonators are picked using formulae (1) and (2) in terms of the Q's of the resonance circuits, $Q_C = \sqrt{C/L}/wY_o$ for the parallel branch, $Q_L = \sqrt{L/C}/wZ_o$ for the series branch.

Figure 8:
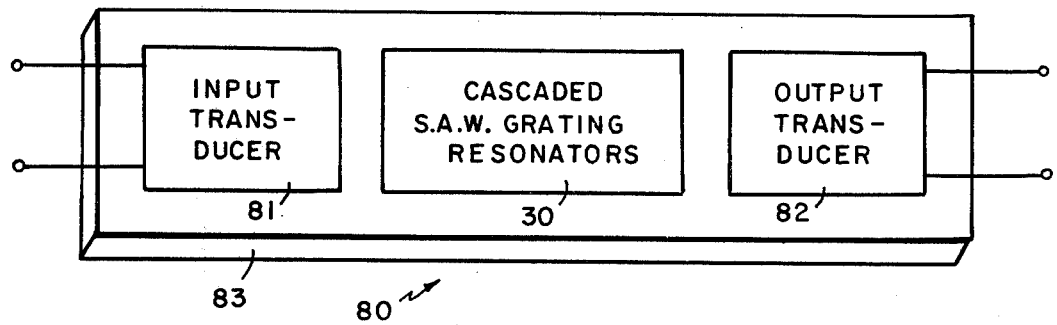
FIG. 8 is a block diagram of the s.a.w. grating filter of this invention.

The techniques for the fabrication of s.a.w. resonators is well known to those skilled in the art. As an example, one form of resonator having a $\kappa$ of 6.439 cm$^{-1}$ is obtained from ion milled grooves of approximately 0.01 of a wavelength depth in LiNbO$_3$. In another typical resonator made with 12$\nu$m 12$\mu$gratings, the gratings are typically formed by indiffusing 1000Å of Ti into LiNbO$_3$ for 30 hours at 1007° C. which provided a coupling coefficient $\kappa$ of 2.53 cm$^{-1}$. The techniques for coupling signals into and out of resonators is also well known to those skilled in the art and is shown in FIG. 8 where the cascaded resonators 30 of FIG. 3 are shown in relation to an input transducer 81 and an output transducer 82 on a s.a.w. propagating substrate 83 to constitute the s.a.w. filter 80 of this invention.

It is evident that those skilled in the art, once given the benefit of the foregoing disclosure, may make numerous other uses and modifications of, and departures from the specific embodiments described herein without departing from the inventive concepts. Consequently, the invention is to be construed as embracing each and every novel combination of features present in, or possessed by, the apparatus and techniques herein disclosed and limited solely by the scope and spirit of the appended claims.

What is claimed is:

1. Surface Acoustic wave filter having a transfer characteristic related to that of any bandpass lumped constant LC filter with a lowpass equivalent comprising
 a plurality of surface acoustic wave grating sections, the reflector (groove) center to center spacing of said grating sections are chosen to be one-half wavelength ($\lambda/2$) at the center frequency $\omega_o$ of the bandpass filter, the half-length of each grating resonator is determined by $$l = 1/\kappa \ln\{a + \sqrt{a^2 + 1}\}$$

where $$a \equiv (\kappa v_g Q / 2\omega_o)$$

and $\kappa$ is the coupling constant of the grating, $v_g$ is the group velocity, and for a bandwidth w in radians/sec $$Q = Q_C = (\omega_o C)/(w Y_o)$$

for each grating resonator corresponding to a capacitor C in each parallel branch of the low pass equivalent; and $$Q = Q_L = (\omega_o L)/(w Z_o)$$

for each grating resonator corresponding to an inductor L in each series branch of the low pass equivalent,
 a cascade of "n" resonators to form a cascade of (n+1) sections, each section consisting of a uniformly spaced grating of lengths $l_1$, $l_1 + l_2$, $l_2 + l_3$, ..., $l_{n-1} + l_n$, $l_n$; respectively,
  said section lengths are selected to provide the nearest integer multiple of reflectors,
  n corresponds to the total number of inductors and capacitors in the lumped constant lowpass filter equivalent,
  the order of cascading of said resonators being the same as the order of occurrence of the capacitos and inductors in the lowpass filter equivalent,
  the centers of the reflectors at the respective ends of adjacent sections are separated by a distance of $\lambda/4$ or $3\lambda/4$,
  an input transducer and an output transducer for coupling to the endmost sections of said cascade of resonators, respctively.

2. Surface acoustic wave (s.a.w.) filter having a transfer characteristic related to that of any bandpass lumped constant LC filter consisting of series resonant circuits in the series branches and parallel resonant circuits in the parallel branches where the resonance frequencies of the resonance circuits may be different comprising
 a cascade of surface acoustic wave grating resonators equal in number to the number of lumped constant resonant circuits, the reflector (groove) center to center spacing of each said grating resonator is chosen to be one-half wavelength at the resonant frequency of its corresponding resonant circuit,
 the Q's of each of the series resonant circuits being given by $$Q_C = \sqrt{C_s/L_s}/Y_o$$

where $Y_o$ is the admittance, and $C_s$ and $L_s$ is the value of the capacitor and inductor, respectively, of each series resonant circuit,
 and the Q's of each of the parallel resonant circuits being given $$Q_L = \sqrt{L_p/C_p}/Z_o$$

where $Z_o$ is the impedance, and $L_p$ and $C_p$ is the value of the inductor and capacitor, respectively, of each parallel resonant circuit, the half-length of each resonator is determined by $$l = (1/\kappa)\ln\{a + \sqrt{a^2 + 1}\}$$

where $$a \equiv (\kappa v_g Q / 2\omega_o)$$

and $\kappa$ is the coupling of the resonator grating, $v_g$ is the group velocity, and Q is either $Q_C$ or $Q_L$ depending upon whether the grating resonator corresponds to a series resonant circuit or a parallel resonant circuit, respectively,
 a cascade of n resonators, each resonator having its reflector center to center spacing adjusted to be $\lambda/2$ at the resonance frequency of its corresponding lumped constant resonance circuit,
 where n corresponds to the total number of series resonant and parallel resonant circuits in the equivalent lumped constant filter,
 the half-lengths of each resonator are selected to provide the nearest integer multiple of reflectors,
 the spacing between adjacent said cascaded resonators being such that the reference plane of the resonator for the series resonance circuit equivalent coincides with the reference plane of the resonator for the parallel resonance circuit equivalent,
 the order of cascading of said resonators being the same as the order of occurrence of the series resonance and parallel resonance circuits of the lumped constant filter equivalent, and
 an input transducer and an output transducer for coupling to the endmost resonators of said cascade of resonators, respectively.

* * * * *